United States Patent [19]

Hirano

[11] 4,392,152
[45] Jul. 5, 1983

[54] SEMICONDUCTOR DEVICE

[75] Inventor: Yutaka Hirano, Atsugi, Japan

[73] Assignee: Fujitsu Limited, Kawasaki, Japan

[21] Appl. No.: 201,410

[22] PCT Filed: Feb. 29, 1980

[86] PCT No.: PCT/JP80/00036
§ 371 Date: Nov. 9, 1980
§ 102(e) Date: Oct. 31, 1980

[87] PCT Pub. No.: WO80/01966
PCT Pub. Date: Sep. 18, 1980

[30] Foreign Application Priority Data

Mar. 9, 1979 [JP] Japan .................................. 54-27303

[51] Int. Cl.³ .......................................... H01L 29/40
[52] U.S. Cl. .......................................... 357/80; 357/68
[58] Field of Search ........................ 357/74, 75, 68, 80

[56] References Cited

U.S. PATENT DOCUMENTS 3,801,881 4/1974 Anazawa .................................. 357/75
3,908,184 9/1975 Anazawa et al. .................... 357/74

Primary Examiner—James W. Davie
Attorney, Agent, or Firm—Staas & Halsey

[57] ABSTRACT

A semiconductor device wherein a semiconductor element is bonded with brazing material on a metalized layer formed on an insulating substrate, with lead wires being used to connect the electrodes of the semiconductor element to the metalized layer. An element bonding area and lead wire connecting areas are provided on the metalized layer and are separated, at the inside of an aperture provided in a sealing member which seals the semiconductor element, by separation regions. Therefore, the brazing material used for securing the semiconductor element to the metalized layer does not flow up to the lead wire connecting areas, thus improving the manufacturing yield and reliability of the semiconductor device.

10 Claims, 7 Drawing Figures

SEMICONDUCTOR DEVICE

DESCRIPTION

BACKGROUND OF THE INVENTION

This invention relates to a semiconductor device, and particularly to the structure of the metalized layer to which a semiconductor element is bonded and to which lead wires extended from the semiconductor element are connected when the element is in a package.

Semiconductor devices composed of compound semiconductor materials such as gallium/arsenic (GaAs) or indium/phosphor (InP), etc., have an expanding field of application because of their availability in a higher frequency range than silicon (Si) devices.

In semiconductor elements which are composed of compound semiconductor materials such as GaAs or InP, etc., the semiconductor substrate consists of a compound semiconductor having semi-insulation characteristics and an active region such as a Schottky barrier field-effect transistor is fabricated on the surface of the compound semiconductor. Such a semiconductor device has an electrode on the active region at the surface of the semiconductor element for the purpose of connection to a reference potential, for example, to the ground potential. The electrode for grounding the semiconductor device is then connected to a metalized layer via a lead wire within the package wherein the semiconductor device is housed.

The semiconductor element is bonded by being brazed onto a metalized layer which is formed on a substrate surface within the package.

FIG. 1 and FIG. 2 respectively disclose an existing package which hermetically seals a microwave GaAs field effect transistor element composed of such a compound semiconductor.

In these figures, 11 denotes an insulating substrate which is composed of a ceramic material such as alumina (Al₂O₃). A metalized layer is selectively formed on one main surface of substrate 11, this metalized layer being basically composed of molybdenum (Mo) - manganese (Mn) or tungsten (W) with plating of gold (Au) at the surface. This metalized layer provides a metalized layer 13 on which a semiconductor element 12 is mounted and metalized layers 15 and 16 to which the lead wires (for example, the gold leads 14) extending from the electrodes of the semiconductor element 12 are connected.

The metalized layers 13, 15, and 16 extend to the other main surface of the insulating substrate 11 via the side surfaces of the insulating substrate 11, while the external connecting terminals 17, 17', 18, and 19 (which are composed of kovar, etc.) are mounted by brazing to the said metalized layer.

In addition, on one main surface of the substrate 11, a member or frame (for hermical sealing) 20 consisting of ceramic material is bonded. The frame 20 surrounds semiconductor element 12 and covers a part of the exposed surface of the substrate 11 and a part of the metalized layers 13, 15 and 16. Moreover, a cap (not illustrated), which is made of kovar or ceramic material, is bonded covering the aperture of the frame 20 and thereby said semiconductor element 12, bonded on the metalized layer 13, is hermetically sealed.

In a semiconductor device having the structure outlined above, brazing material 21 (gold(Au)-tin(Sn), etc.) is used for bonding the semiconductor element 12 onto the metalized layer 13 as is shown in the enlarged view of FIG. 3. Since the brazing material 21 has been melted, it is spread to a wide area on the metalized layer 13 around the semiconductor element 12. Assuming that the semiconductor element is a GaAs field effect transistor, for example, and its source electrodes must be grounded through connection to the metalized layer 13, lead wires 23 and 23' must be kept away from the extensive brazing material 21 when they connect the source electrodes 22 and 22' of semiconductor element 12 to metalized layer 13.

In addition, exposure of a relevant semiconductor device to a high temperature after connection of such lead wires may cause brazing material 21 to flow up to the connecting points of the lead wires 23 or 23' on the metalized layer 13, thus lowering the bond strength of the lead wires and in some cases disconnecting them.

In FIG. 3, reference number 24 denotes a gate electrode forming the input electrode; reference number 25 denotes a drain electrode used as the output electrode; reference numbers 26 and 27 denote lead wires for connecting these electrodes and metalized layers 15 and 16 for external connections. Attempting to prevent the aforesaid phenomenon by lengthening lead wires 23 and 23' which extend to the metalized layer 13 from the bonding area of the semiconductor element 12, will increase the physical dimensions of the semiconductor device. Moreover, completely isolating the metalized layer on which the semiconductor element is bonded from the metalized layers to which the lead wires are connected has been considered, but this would make it difficult to perform the gold plating process.

SUMMARY OF THE INVENTION

It is an object of this invention to offer a semiconductor device which has a structure ensuring satisfactory connection of the lead wires to the metalized layer on which said semiconductor element is mounted and bonded.

It is another object of this invention to offer a semiconductor device which as a structure ensuring satisfactory connection of the lead wires extended from the electrodes of the semiconductor element to the metalized layer on which the semiconductor element is mounted.

It is another object of this invention to offer a semiconductor device with reduced dimensions wherein the lead wires extending from the electrodes of the semiconductor element are connected to the metallized layer on which the semiconductor element is mounted.

It is a further object of this invention to highly reliable semiconductor device wherein the lead wires extending from the electrodes of the semiconductor element are connected to the metallized layer on which the semiconductor element is mounted.

According to this invention, these objects are attained by a semiconductor device having an insulating substrate, a metalized layer formed on said substrate, a semiconductor element bonded on said metalized layer with brazing material, lead wires extending from the semiconductor element, and a sealing member disposed around the semiconductor element, the metalized layer being separated into a semiconductor element bonding area and lead wire connecting areas at the inside aperture of the sealing member.

DESCRIPTION OF THE PREFERRED EMBODIMENTS

According to this invention, in a semiconductor device comprising an insulating substrate, a metalized layer formed on the insulating substrate, a semiconductor element bonded on the metalized layer with brazing material, lead wires extending from the semiconductor element, and a sealing member disposed around the semiconductor element, said metalized layer is separated into the semiconductor element bonding part and a lead wire connecting part at a inside of an aperture provided in the sealing member.

Therefore, the brazing material is prevented from flowing into the lead wire connecting part by means of the separated area and sealing member when the lead wires are connected to the metalized layer after the semiconductor element is bonded with brazing material on the metalized layer. This simplifies the lead wire connecting work and improves the reliability of the connection.

This invention will be explained in detail hereunder by referring to the preferred embodiments.

Embodiment 1

Figure 1:
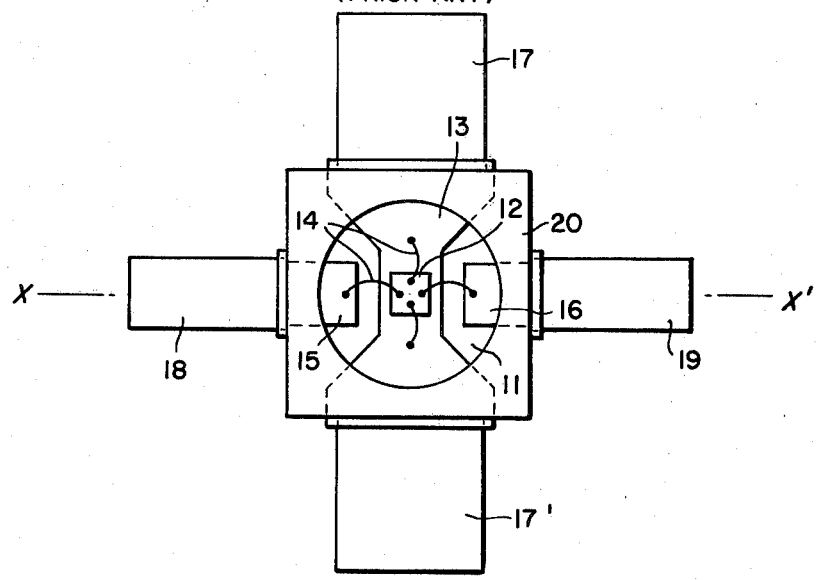
FIG. 1 is a plan view indicating an example of an existing semiconductor device.
Figure 2:
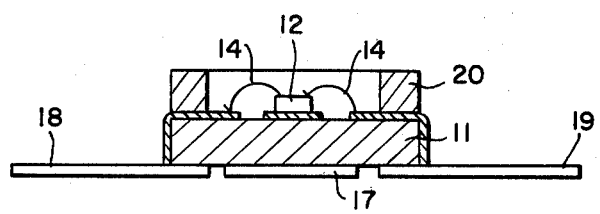
FIG. 2 is a cross section taken along the line X-X' of the semiconductor device shown in FIG. 1.
Figure 3:
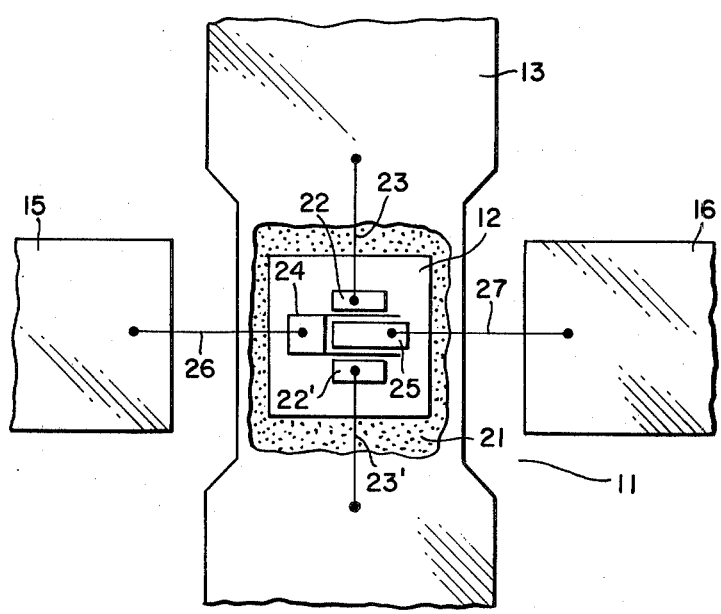
FIG. 3 is a plan view indicating the structure of the metalized layer on which the semiconductor element is bonded and to which the lead wires extending from the electrodes of the semiconductor element are connected, in the semiconductor device shown in FIG. 1.
Figure 5:
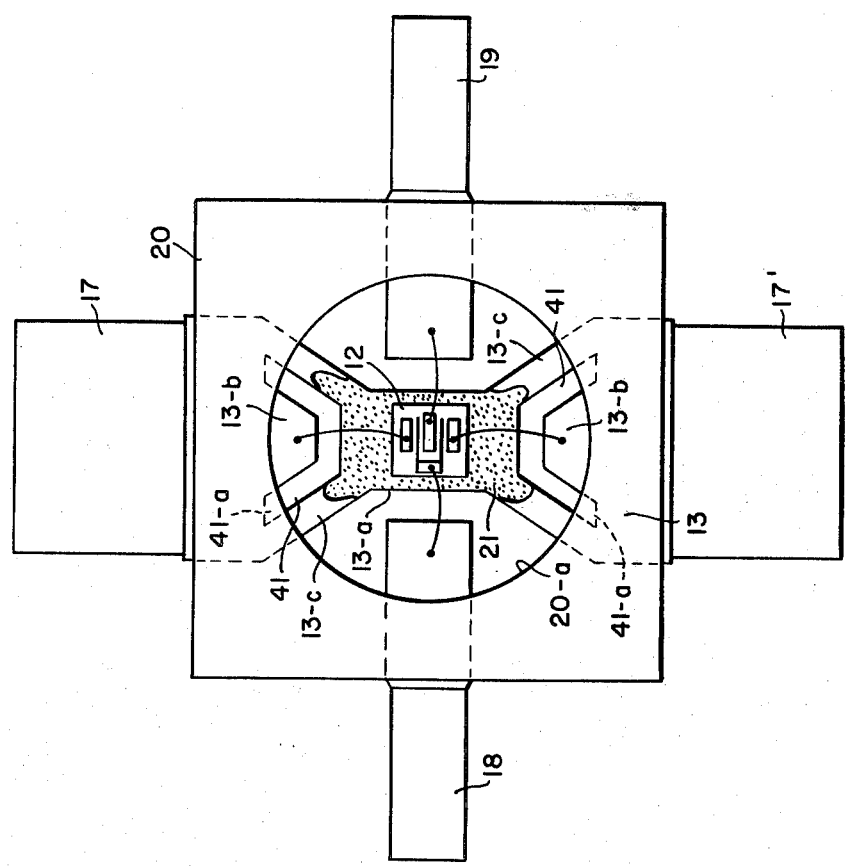
FIG. 5 is a plan view indicating the structure of the first embodiment of the semiconductor device of this invention.
Figure 4:
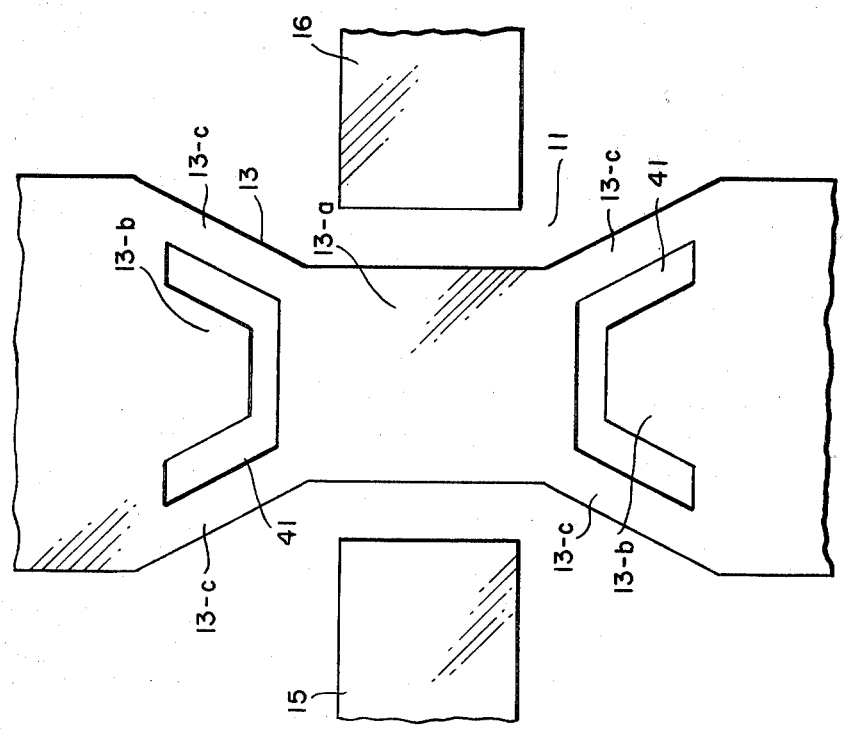
FIG. 4 is a plan view which indicates the pattern of the metalized layer on which a semiconductor element is bonded and to which the lead wires extended from the electrodes of the semiconductor element are connected, in a first embodiment of the semiconductor device of this invention.

FIG. 4 and FIG. 5 show the first embodiment of the semiconductor device of this invention. In these figures, the same portions as those in the preceding FIG. 1 to FIG. 3 are given the same numbering. FIG. 4 shows the structure of the metalized layer in this invention, while FIG. 5 shows a semiconductor element mounted on a substrate within a sealing frame.

As shown in FIG. 4, in the semiconductor device of this invention the separation region 41, consisting of a non-metalized region which separates the metalized region 13 into the element bonding area 13-a and lead wire connecting areas 13-b, is formed in the metalized layer 13. Layer 13 is composed of tungsten(W)-nickel(-Ni)-gold(Au) and is formed on an insulating substrate 11 composed of a ceramic material, allowing bonding of a semiconductor element 12 such as a GaAs field effect transistor, etc.

Selective formation of such a metalized layer is realized by the ordinary silk screen method. As shown in FIG. 4, the separation region 41 isolates the metalized layer 13 into the element bonding area 13-a and lead wire connecting areas 13-b only at the areas adjacent to the semiconductor element bonding area, and the metalized layer 13 is integrated between separation regions 41 and the area where the external connecting terminals are bonded.

When a semiconductor element is bonded on the element bonding area 13-a of the metalized layer 13 using a brazing material 21 such as gold-tin, etc., this structure allows the brazing material 21, even if it becomes fluid due to a temperature rise at the time of bonding (about 290° C. when gold-tin is used as the brazing material) or if it becomes fluid later (for example, due to the use of heat for bonding a cap onto the hermetically sealing frame), to flow only to the metalized layer 13-c from the element bonding areas 13-a. The structure does not allow the brazing material to flow up to the lead wire connecting areas 13-b of said metalized layer 13.

Therefore, the lead wires extending from the electrodes (source electrodes) of a semiconductor element, for example, a GaAs field effect transistor bonded on the element bonding area 13-a can easily be connected to the lead wire connecting area 13-b. Moreover the lead wires will not become disconnected nor will the security of the connection deteriorate as a result of flowing brazing material even if a temperature rise occurs after the assembly of the semiconductor device.

In realizing the preferred embodiment of this invention, the size of the aperture 20a of the hermetically sealing member or frame 20, consisting of ceramic material, and the size of the isolation region 41, are determined so that the internal wall of said frame 20 is placed inside of the external end 41-a of the separation region 41 provided in the metalized layer 13, as shown in FIG. 5. This structure can more effectively prevent trouble due to an unwanted flow of brazing material, as mentioned previously, because the flow of brazing material 21 on the metalized layer 13-c is stopped by the internal wall of the frame 20.

Embodiment 2

Figure 7:
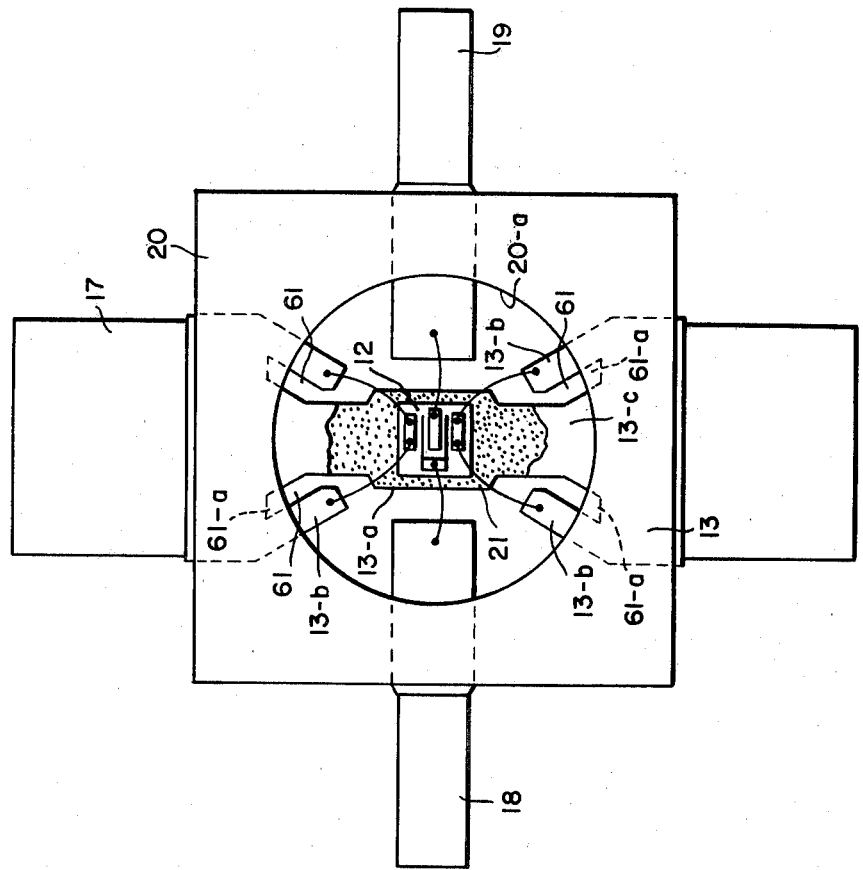
FIG. 7 is a plan view indicating the structure of the second embodiment of the semiconductor device of this invention.
Figure 6:
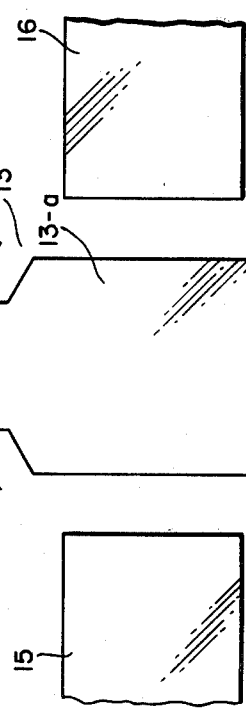
FIG. 6 is a plan view which indicates the pattern of the metalized layer on which a semiconductor element is bonded and to which the lead wires extended from the electrodes of the semiconductor element are connected, in the second embodiment of the semiconductor device of this invention.

FIG. 6 and FIG. 7 show a second embodiment of the semiconductor device of this invention. In these figure, the same portions as those in the previous FIG. 1 to FIG. 5 are given the same numbering. FIG. 6 shows the pattern of the metalized layer of this invention, while FIG. 7 shows a mounted semiconductor element and hermetically sealing frame, etc.

As shown in FIG. 6, the semiconductor device of this invention disposes a separation region 61 (consisting of a non-metalized part which isolates the metalized layer 13 which is formed on the insulating substrate 11 and which allows bonding of a semiconductor element 12, such as a GaAs field effect transistor) between the element bonding area 13-a and the lead wire connecting areas 13-b. As shown in the figure, the separation region 61 isolates the metalized layer into the element bonding area 13-a and lead wire connecting area 13-b only at the areas adjacent to the semiconductor element bonding area, and the element bonding areas 13-a and the lead wire connecting areas 13-b are linked further out.

When semiconductor element is secured to the element bonding area 13-a of the metalized layer 13, using brazing material 21 such as gold-tin, etc., this structure allows the brazing material 21 to flow only to the metalized layer 13-c from the element bonding area 13-a, and never allows it to flow up to the lead wire connecting areas 13-b of the metalized layer 13. Therefore, the lead wires extended from the semiconductor element secured onto the element bonding area 13-a can be connected easily to the lead wire connecting area 13-b, so that the bond strength of the lead wires will not deteriorate nor will the wires become disconnected due to a flow of the brazing material 21, even if the temperature rises after the assembly of the semiconductor device.

In realizing the preferred embodiment of this invention, the size of the aperture 20-a of the hermetically sealing frame 20 and the size of the separation region 61 are determined so that the internal wall of the frame 20 is placed inside of the external ends 61-a of the separation regions 61 provided on the metalized layer 13. Such a structure stops the flow of the brazing material 21 on the metalized layers 13-c because of the internal wall of the frame 20, thereby increasing the protection against trouble due to unwanted flow of the brazing material, as mentioned previously.

According to this invention, as explained above, by selecting the pattern of the metalized layer formed on the insulating substrate and the aperture size of the hermetically sealing member, flow of the fluid brazing material up to the lead wire connecting area from the semiconductor element bonding area on the metalized layer can be prevented successfully.

Therefore, lead wires can easily be connected to the metalized layer with a high degree of reliability, thereby improving the reliability of the relevant semiconductor device. Moreover, the semiconductor bonding area and the lead wire connecting areas of the metalized layer can be very closely placed on both sides of the separation region and thereby the size of the semiconductor can be reduced.

In addition, the metalized layer in the present invention is not separated electrically into the element bonding area and lead wire connecting areas so that the gold plating process is not influenced.

What is claimed is:

1. A semiconductor device, comprising: an insulating substrate, an integral metalized layer formed on said substrate, brazing material, a lead wire extending from said semiconductor element to said metalized layer on which said semiconductor element is mounted, and a hollow hermetically sealing member having an inner wall disposed around said semiconductor element, wherein said metalized layer on which said semiconductor element is bonded by means of said brazing material and to which said lead wire extends is separated by a separation area therein into a semiconductor element bonding area where said semiconductor element is bonded to said metalized layer and a lead wire connecting area where said lead wire is connected to said metalized layer at the inside of said wall of said sealing member.

2. A semiconductor device as claimed in claim 1, wherein the separation area separating said metalized layer into said semiconductor element bonding area and said lead wire connecting area at the inside of said wall is provided by a non-metalized region between said semiconductor bonding area and said lead wire connecting area.

3. A semiconductor device as claimed in claim 1, wherein said sealing member comprises an insulating frame.

4. A semiconductor device as claimed in claim 1, wherein said semiconductor element is a GaAs field effect transistor.

5. A semiconductor device as claimed in claim 4, wherein said lead wire extending to said lead wire connecting area of said metalized layer is connected to a source electrode of the GaAs field effect transistor.

6. An improved semiconductor device of the type wherein a semiconductor element is brazed to an integral metalized layer on an insulating substrate and a lead wire extending from the active region of the semiconductor element is connected to the metalized layer on which the semiconductor element is brazed, the semiconductor element being enclosed by a hollow member having an inner wall, wherein the improvement comprises:

the metalized layer on which the semiconductor element is brazed and to which the lead wire extending from the active region of the semiconductor element is connected has a non-metalized region positioned between the semiconductor element and the point at which the lead wire is connected to the metalized layer.

7. The device of claim 6, wherein the non-metalized region extends between the substrate and the inner wall of the hollow member.

8. The device of claim 7, wherein the non-metalized region is generally V-shaped, the two legs of the V extending beyond the inner wall of the hollow member with the apex of the V being within the hollow member.

9. The device of claim 7, wherein the non-metalized region extends from the periphery of the metalized layer within the hollow member to a point beyond the inner wall of the hollow member.

10. The device of claim 6, 7, 8, or 9, wherein the semiconductor element comprises a GaAs field effect transistor having a source and the lead wire extends from said source to the metalized layer.

* * * * *

UNITED STATES PATENT AND TRADEMARK OFFICE
CERTIFICATE OF CORRECTION

PATENT NO. : 4,392,152
DATED : July 5, 1983
INVENTOR(S) : Hirano

It is certified that error appears in the above-identified patent and that said Letters Patent is hereby corrected as shown below:

Col. 1, line 42, after "with" insert --a--.

Col. 2, line 39, after "mounted" insert --.--; delete "and"
line 40, delete "bonded.";
line 51, "metallized" should be --metalized--;
line 53, after "to" insert --offer a--;
line 56, "metallized" should be --metalized--.

Col. 3, line 40, "the" should be --a--;
line 41, "a" (second occurrence) should be --the--.

Col. 4, line 36, "20a" should be --20-a--;
line 50, "figure" should be --figures--.

Signed and Sealed this

Twenty-first Day of February 1984

[SEAL]

Attest:

GERALD J. MOSSINGHOFF

Attesting Officer

Commissioner of Patents and Trademarks